United States Patent
Kim

(10) Patent No.: US 10,240,057 B2
(45) Date of Patent: Mar. 26, 2019

(54) CONDUCTIVE POLYMERIC INK COMPOSITION

(71) Applicant: LG CHEM, LTD., Seoul (KR)

(72) Inventor: Mi-Kyoung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 4 days.

(21) Appl. No.: 15/318,318

(22) PCT Filed: May 29, 2015

(86) PCT No.: PCT/KR2015/005395
§ 371 (c)(1),
(2) Date: Dec. 12, 2016

(87) PCT Pub. No.: WO2015/190727
PCT Pub. Date: Dec. 17, 2015

(65) Prior Publication Data
US 2017/0121549 A1    May 4, 2017

(30) Foreign Application Priority Data

Jun. 13, 2014   (KR) .................. 10-2014-0071829
May 28, 2015   (KR) .................. 10-2015-0074616

(51) Int. Cl.
| | | |
|---|---|---|
| H01B 1/00 | (2006.01) | |
| C09D 5/24 | (2006.01) | |
| C09D 11/52 | (2014.01) | |
| H01B 1/12 | (2006.01) | |
| C09D 11/102 | (2014.01) | |

(Continued)

(52) U.S. Cl.
CPC .............. *C09D 11/52* (2013.01); *C09D 5/24* (2013.01); *C09D 11/102* (2013.01); *H01B 1/127* (2013.01); *H01L 51/0005* (2013.01); *H01L 51/0035* (2013.01); *H01L 51/0037* (2013.01); *H01L 51/442* (2013.01); *H01L 51/5206* (2013.01); *H01L 51/5234* (2013.01);

(Continued)

(58) Field of Classification Search
CPC ........... H01B 1/127; C09D 5/24; C09D 11/52
See application file for complete search history.

(56) References Cited

U.S. PATENT DOCUMENTS 5,728,321 A  *  3/1998  Abe .................. C08G 73/0266
                                                    252/500
6,756,473 B2    6/2004  Reuter et al.
(Continued)

FOREIGN PATENT DOCUMENTS

| CA | 2415120 | * | 6/2003 |
|---|---|---|---|
| CN | 1428344 | | 7/2003 |

(Continued)

*Primary Examiner* — Mark Kopec
(74) *Attorney, Agent, or Firm* — Dentons US LLP

(57) ABSTRACT

Disclosed is a conductive polymeric ink composition, wherein pH of the ink composition can be adjusted to a desired neutral pH value while maintaining dispersibility of PEDOT:PSS (Poly(3,4-ethylenedioxythiophene):poly(styrenesulfonate)) used as a main component of the ink composition, thereby solving problems due to strong acidity, including a reduction in the lifetime of devices. Furthermore, a transparent conductive polymer thin film formed from the ink composition has low haze, low surface resistance and high conductivity, compared to thin films manufactured conventionally.

6 Claims, 1 Drawing Sheet

(51) Int. Cl.
   *H01L 51/00*      (2006.01)
   *H01L 51/44*      (2006.01)
   *H01L 51/52*      (2006.01)

(52) U.S. Cl.
   CPC ...... *H01L 51/0021* (2013.01); *H01L 51/5203* (2013.01); *Y02E 10/549* (2013.01)

(56) References Cited

U.S. PATENT DOCUMENTS

| | | | |
|---|---|---|---|
| 7,431,866 B2* | 10/2008 | Hsu | B82Y 10/00 252/500 |
| 7,820,078 B2 | 10/2010 | Louwet | |
| 2009/0148722 A1* | 6/2009 | Louwet | C08L 65/00 428/690 |
| 2011/0117329 A1 | 5/2011 | Jonas et al. | |
| 2012/0097898 A1 | 4/2012 | Seshadri et al. | |
| 2014/0084225 A1* | 3/2014 | Kanto | C09D 5/24 252/519.31 |
| 2014/0370297 A1* | 12/2014 | Kim | H01B 1/127 428/412 |

FOREIGN PATENT DOCUMENTS

| | | |
|---|---|---|
| CN | 101821815 | 9/2010 |
| CN | 101883811 | 11/2010 |
| EP | 2336255 A1 | 6/2011 |
| JP | 2008285504 | 11/2008 |
| JP | 2011201933 | * 10/2011 |
| JP | 2011201933 A | 10/2011 |
| JP | 4999540 B2 | 8/2012 |
| KR | 1020080063807 A | 7/2008 |
| KR | 1020120006562 A | 1/2012 |
| KR | 1020130038398 A | 4/2013 |
| KR | 1020130045298 A | 5/2013 |
| WO | 2010127253 A1 | 4/2010 |
| WO | 2010104349 A2 | 9/2010 |

* cited by examiner

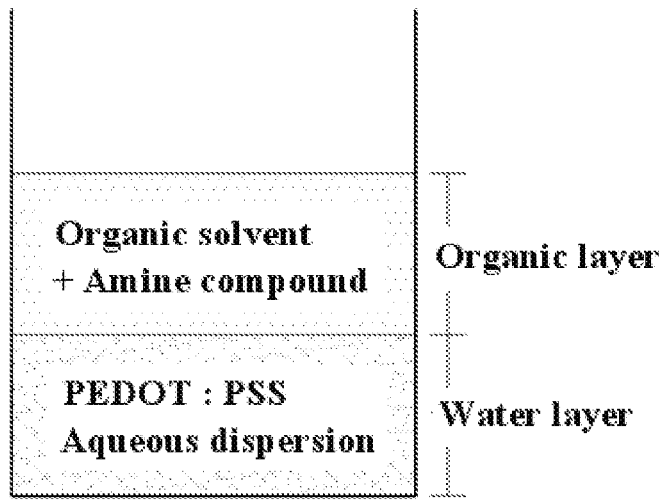

CONDUCTIVE POLYMERIC INK COMPOSITION

CROSS REFERENCE TO RELATED APPLICATION

This application is a National Stage Application of International Application No. PCT/KR2015/005395, filed May. 29, 2015, and claims the benefit of Korean Patent Application No. 10-2015-0074616, filed May. 28, 2015, and Korean Patent Application No. 10-2014-0071829, filed Jun. 13, 2014, the contents of which are incorporated herein by reference in their entirety for all purposes as if fully set forth below.

BACKGROUND OF THE INVENTION

1. Technical Field

The present invention relates to an ink composition comprising a conductive polymer and, more particularly, to a conductive polymeric ink composition having controlled pH, wherein pH of the ink composition is adjusted to a desired neutral pH value while maintaining dispersibiltiy of PEDOT:PSS (Poly(3,4-ethylenedioxythiophene):poly(styrenesulfonate)) used as a main component of the ink composition, thereby solving problems due to strong acidity, including a reduction in the lifetime of devices, and also in which a transparent conductive polymer thin film formed from the ink composition has low haze, low resistance and high conductivity, compared to thin films manufactured conventionally.

2. Description of the Related Art

PEDOT:PSS (Poly(3,4-ethylenedioxythiophene):poly(styrenesulfonate)) is currently actively utilized in photo-electronic organic devices and so on because of high electrical conductivity and transparency thereof. In particular, PEDOT:PSS films may be applied to touch screens, organic light emitting diodes, and e-papers. To this end, conductivity thereof is required to increase using dimethyl sulfoxide, sorbitol, ionic liquids, and surfactants.

Also, PEDOT:PSS may be employed for a transparent electrode or a hole transport layer for OPV (Organic Photovoltaics), OLED (Organic Light Emitting Diode), etc. However, the use of PEDOT:PSS having strong acidity (pH 1~2) may undesirably result in shortened lifetime of devices and corroded systems. To solve such problems, many attempts have been made to control the pH of PEDOT:PSS to a neutral pH value using a strong alkaline solution such as ammonia water or sodium hydroxide (NaOH). In this case, however, the dispersibility of PEDOT:PSS may deteriorate to thus remarkably decrease conductivity. Hence, there is a need for a method of adjusting the pH of PEDOT:PSS to a neutral pH value while maintaining the dispersibility of PEDOT:PSS.

CITATION LIST

Patent Literature

KR 10-2008-0063807 A
KR 10-2013-0045298 A

SUMMARY OF THE INVENTION

Accordingly, the present invention has been made keeping in mind the problems encountered in the related art, and an object of the present invention is to provide an ink composition having high conductivity, wherein pH of the ink composition may be adjusted to a neutral pH value while maintaining dispersibility of PEDOT:PSS used as a main component of the ink composition.

In order to accomplish the above object, the present invention provides a method of preparing a neutralized PEDOT:PSS aqueous dispersion, comprising: a) mixing a PEDOT:PSS aqueous dispersion with an amine compound and an organic solvent that is separated from water, thus neutralizing the PEDOT:PSS aqueous dispersion; b) separating the mixture obtained in a) into a lower water layer including the neutralized PEDOT:PSS aqueous dispersion and an upper organic layer including the amine compound and the organic solvent; c) removing the upper organic layer; and d) washing the water layer separated from the organic layer with an organic solvent to remove the organic layer, yielding the neutralized PEDOT:PSS aqueous dispersion.

In addition, the present invention provides a neutralized PEDOT:PSS aqueous dispersion, prepared by the method as above.

In addition, the present invention provides a conductive polymeric ink composition, comprising 1) a neutralized PEDOT:PSS aqueous dispersion prepared by the above method, 2) dimethyl sulfoxide, 3) a solvent, and 4) a surfactant.

In addition, the present invention provides a transparent electrode, comprising a transparent conductive polymer thin film formed from the above ink composition.

In addition, the present invention provides an organic light emitting diode, comprising a transparent conductive polymer thin film formed from the above ink composition, as a buffer layer, an electrode layer, or a hole transport layer.

In addition, the present invention provides an organic photovoltaic cell, comprising a transparent conductive polymer thin film formed from the above ink composition, as a buffer layer, an electrode layer, or a hole transport layer.

According to the present invention, when an ink composition including a neutralized PEDOT:PSS aqueous dispersion is used, pH of the ink composition can be adjusted to a desired neural pH value while maintaining dispersibility of PEDOT:PSS. Hence, problems due to strong acidity, including a reduction in the lifetime of devices or corrosion of systems, can be solved. Furthermore, haze caused by scattering of light on a substrate can be lowered, and resistance can also be decreased, making it possible to form a conductive polymer thin film having high conductivity.

Therefore, according to the present invention, a transparent conductive polymer thin film formed from the ink composition has high conductivity, and can thus be utilized as a transparent electrode, instead of ITO, and also can be employed as an electrode layer, a buffer layer, or a hole transport layer for organic photovoltaic cells.

BRIEF DESCRIPTION OF THE DRAWING

FIG. 1 illustrates separation of an organic layer and a water layer in a process of preparing a neutralized PEDOT:PSS aqueous dispersion according to the present invention.

DESCRIPTION OF THE SPECIFIC EMBODIMENTS

Hereinafter, a detailed description will be given of the present invention.

The present invention addresses a method of providing an ink composition having high conductivity, wherein pH of the ink composition may be adjusted to a neutral pH value while maintaining dispersibility of PEDOT:PSS used as a main component of the ink composition. Specifically, a method of preparing a neutralized PEDOT:PSS aqueous dispersion comprises: a) mixing a PEDOT:PSS aqueous dispersion with an amine compound and an organic solvent that is separable from water, thus neutralizing the PEDOT:PSS aqueous dispersion; b) separating the mixture obtained in a) into a lower water layer including the neutralized PEDOT:PSS aqueous dispersion and an upper organic layer including the amine compound and the organic solvent; c) removing the upper organic layer; and d) washing the water layer separated from the organic layer with an organic solvent to remove the organic layer, yielding the neutralized PEDOT:PSS aqueous dispersion.

The PEDOT:PSS aqueous dispersion is a polymer mixture comprising PEDOT and PSS ionomers, and is an electrically charged macromolecular salt, namely, a conductive polymer material. When a hole transport layer for an organic photovoltaic cell is manufactured using the conductive polymer material, the hole transport layer functions as a buffer layer between energy barriers generated in a metal (electrode) and a semiconductor, which are in contact, and also facilitates the movement of holes. Furthermore, it plays a role in that contact of inorganic and organic materials between a lower electrode layer and an active layer is made easy. However, since PSS of the PEDOT:PSS aqueous dispersion is an acidic material, it may corrode (or etch) the lower electrode layer (e.g. ITO) for organic photovoltaic cells, undesirably shortening the lifetime of organic photovoltaic cells. Hence, when the acidic pH of the composition for a hole transport layer is adjusted to neutral pH using an alkaline material, damage to the lower electrode layer may be prevented, ultimately prolonging the lifetime of organic photovoltaic cells. However, in the case where the pH of PEDOT:PSS is adjusted to neutral pH by the addition of an alkaline solution, the dispersibility of PEDOT:PSS may deteriorate, remarkably decreasing conductivity. Therefore, the present inventors have studied methods of adjusting the pH of PEDOT:PSS to neutral pH while maintaining the dispersibility of PEDOT:PSS, thus culminating in the present invention.

Specifically, the method of preparing the neutralized PEDOT:PSS aqueous dispersion according to the present invention includes indirect addition of an amine compound that is a kind of alkaline material to ensure neutral pH of the PEDOT:PSS aqueous dispersion, in lieu of conventional direct addition of a strong alkaline material such as ammonia water or NaOH. This addition is performed in such a manner that the amine compound is added together with the organic solvent that is separated from water, thus preventing a direct influence on the PEDOT:PSS layer. The amine compound may include at least one selected from the group consisting of a primary amine compound, a secondary amine compound, a tertiary amine compound, and a pyridine compound. A specific example of the amine compound may include at least one selected from the group consisting of triethylamine, 3,5-lutidine, and 2,4,6-trimethylpyridine.

Also, the organic solvent, which is separated from water added to separate a lower water layer including the PEDOT:PSS aqueous dispersion and an upper organic layer including the amine compound and the organic solvent, may be exemplified by diethyl ether. The organic solvent functions to physically separate two layers. Since the amine compound is more efficiently dissolved in the organic solvent than in water, a large amount of the added amine compound remains in the organic layer, and the amine compound may come into contact with the water layer (PEDOT:PSS) at only the interface between the organic layer and the water layer. The amine compound may be gradually dissolved in water. The amount of the organic solvent in a) may be 50~500 parts by weight based on 100 parts by weight of the PEDOT:PSS aqueous dispersion. Given the above organic solvent amount range, the concentration of the amine compound may be maintained at an appropriate level, effectively neutralizing PEDOT:PSS under the condition that dispersibility thereof is not deteriorated. If the amount of the organic solvent is less than the lower limit, the PEDOT:PSS layer may be directly affected by the amine compound and thus the dispersibility thereof may deteriorate, undesirably decreasing conductivity.

Also, the amine compound in a) is preferably contained so that its concentration in the organic solvent is 0.1~50 wt %. Given the above amine compound amount range, it is possible to adjust the pH of PEDOT:PSS while maintaining the dispersibility of PEDOT:PSS.

Also, in the method of preparing the neutralized PEDOT:PSS aqueous dispersion, mixing in a) is preferably performed for 5 min~24 hr, and more preferably 30 min~4 hr. This mixing time may vary depending on the concentration.

The water layer and the organic layer, which are separated from each other, are physically mixed. Specific examples of the mixing process may include, but are not limited to, mixing using a shaker, stirring using a magnetic bar, and vortex mixing.

Then, the upper organic layer is removed, after which washing the water layer separated from the organic layer with an organic solvent is repeated 1~5 times, and preferably 2~3 times, thus removing the upper organic layer, yielding a neutralized PEDOT:PSS aqueous dispersion.

In the course of removing the organic layer, some of the water layer may be lost. Hence, the amount of the finally obtained PEDOT:PSS aqueous dispersion may be 70~90 parts by weight relative to 100 parts by weight of the initially added PEDOT:PSS aqueous dispersion.

Then, removing the remaining organic solvent and amine compound may be additionally carried out.

In addition, the present invention addresses a neutralized PEDOT:PSS aqueous dispersion prepared by the above method. The neutralized PEDOT:PSS aqueous dispersion contains the amine compound in an amount of preferably 0.001~3.0 wt %, and more preferably 0.01~1.0 wt %, based on the total weight thereof.

In the neutralized PEDOT:PSS aqueous dispersion prepared by the method according to an embodiment of the present invention, the amine compound may be left behind in a small amount in the PEDOT:PSS aqueous dispersion after neutralization, compared to when directly adding the amine compound to the ink composition, thereby maintaining the dispersibility of PEDOT:PSS. Accordingly, the pH of the resulting ink composition may be adjusted to a desired neutral pH value. Also, when forming the ink composition from the neutralized PEDOT:PSS aqueous dispersion according to the present invention, haze caused by scattering of light on a substrate may be lowered, and the resulting thin film may have low resistance and thus may exhibit high conductivity.

In addition, the present invention addresses a conductive polymeric ink composition having controlled pH, comprising: 1) a neutralized PEDOT:PSS aqueous dispersion prepared by the above method, 2) dimethyl sulfoxide (DMSO), 3) a solvent, and 4) a surfactant.

1) The neutralized PEDOT:PSS aqueous dispersion refers to a water-based dispersion solution including a PEDOT:PSS polymer or copolymer, and the PEDOT:PSS aqueous dispersion used herein is a PEDOT:PSS aqueous dispersion obtained after the neutralizing process.

The amount of the PEDOT:PSS aqueous dispersion is preferably 10~60 wt % based on the total weight of the ink composition. If the amount thereof is less than 10 wt %, it is difficult to ensure sufficient conductivity attributable to an insufficient amount of PEDOT:PSS. In contrast, if the amount thereof exceeds 60 wt %, spreadability may become poor, thus making it difficult to form a uniform thin film and incurring poor jetting properties upon inkjetting.

In a preferred embodiment of the present invention, PH-1000 made by Heraeus is used as the PEDOT:PSS aqueous dispersion.

2) DMSO is added to improve conductivity of the ink composition, and the amount thereof is preferably 0.3~5.0 wt % based on the total weight of the ink composition. If the amount thereof is less than 0.3 wt %, there are no improvements in conductivity. In contrast, if the amount thereof exceeds 5.0 wt %, the resulting ink may have low conductivity and low stability.

3) The solvent may include a) deionized water (DI water) and b) polyhydric alcohol.

a) DI water functions to disperse the PEDOT:PSS aqueous dispersion, and the amount thereof is preferably 10~60 wt % based on the total weight of the ink composition. If the amount of DI water exceeds 60 wt % based on the total weight of the ink composition, the resulting ink has high surface tension, and thus is not spread on the substrate and is unlikely to be adequately jetted. In contrast, if the amount thereof is less than 10 wt %, the resulting ink has high viscosity and is thus unsuitable for use in inkjetting.

b) The polyhydric alcohol may include, but is not necessarily limited to, diethylene glycol, ethylene glycol, propylene glycol, glycerol, and sorbitol. Preferably useful is propylene glycol or glycerol.

The polyhydric alcohol is contained in the solvent to increase conductivity and dispersibility of the ink composition. The amount thereof is preferably 1~45 wt % based on the total weight of the ink composition. If the amount thereof exceeds 45 wt %, conductivity may decrease. In contrast, if the amount thereof is less than 1 wt %, there are no improvements in conductivity.

In another embodiment of the present invention, the ink composition may further comprise an additional solvent to improve process properties (jetting properties) of the ink composition and conductivity thereof.

The additional solvent may include, but is not necessarily limited to, an organic solvent, such as butyl carbitol or triethyl phosphate.

The amount of butyl carbitol or triethyl phosphate as the additional solvent is preferably 1.0~40 wt % based on the total weight of the ink composition. If the amount thereof exceeds 40 wt %, processability may decrease. In contrast, if the amount thereof is less than 1.0 wt %, there are no improvements in processability.

4) The surfactant is used to enhance spreadability of the ink composition, and the amount thereof is preferably 0.01~3.0 wt % based on the total weight of the ink composition. If the amount thereof is less than 0.01 wt %, spreadability cannot be obtained as desired. In contrast, if the amount thereof exceeds 3.0 wt %, conductivity of the ink may decrease.

The surfactant preferably includes, but is not limited to, a nonionic surfactant, especially a fluorine-based surfactant.

The conductive polymeric ink composition preferably has a pH of 4.0~10.0, and more preferably 5.0~8.0. Given the above pH range, the pH of the ink composition may be adjusted in the desired range while maintaining dispersibility thereof, thereby solving problems due to strong acidity, including damage to the lower electrode layer to thus reduce the lifetime of devices or corrosion of systems. If the pH of the ink composition is less than 4.0, damage to the lower electrode layer may be caused by high acidity. In contrast, if the pH thereof is higher than 10.0, hole transports of the hole transport layer may be obstructed, undesirably deteriorating energy conversion efficiency upon application to organic photovoltaic cells.

Typical examples of forming a PEDOT:PSS thin film on a substrate using the ink composition according to the present invention may include slot die coating, bar coating, spin coating, inkjet printing, and spray coating. Particularly useful is inkjet printing in terms of the use of a feed material in a small amount and direct patterning on a desired position.

Also, a transparent conductive polymer thin film formed by inkjet printing using the ink composition according to the present invention exhibits high transmittance and high conductivity of the PEDOT:PSS thin film.

Another aspect of the present invention addresses a transparent electrode, comprising a transparent conductive polymer thin film formed from the ink composition as above.

Still another aspect of the present invention addresses an organic light emitting diode (OLED), comprising the above transparent conductive polymer thin film, as a buffer layer, an electrode layer, or a hole transport layer.

Yet another aspect of the present invention addresses an organic photovoltaic cell (OPV), comprising the above transparent conductive polymer thin film, as a buffer layer, an electrode layer, or a hole transport layer.

A better understanding of the present invention may be obtained via the following examples that are merely set forth to illustrate, and such examples may be appropriately modified and altered within the scope and spirit of the invention, as apparent to those skilled in the art.

EXAMPLE 1

4 g of PH-1000 (made by Heraeus) as a PEDOT:PSS aqueous dispersion was added with 4 g of diethyl ether and 0.05 g of triethylamine Mixing was performed for 2 hr so that a water layer and an organic layer were combined, after which the organic layer was removed. Also, 4 g of diethyl ether was further added to wash the water layer, after which the organic layer was decanted. Washing the water layer was repeated 2~3 times, thus obtaining a neutralized PEDOT:PSS aqueous dispersion. The amount of the amine compound triethylamine contained in 4.2 g of the neutralized PEDOT:PSS aqueous dispersion thus obtained was measured to be 0.017 g. 4.2 g of the neutralized PEDOT:PSS aqueous dispersion was added with 0.18 g of DMSO, 3.6 g of DI water, 2.16 g of propylene glycol, 1.44 g of butyl carbitol, and 0.006 g of a surfactant F-555 (made by DIC) and then stirred, yielding a PEDOT:PSS ink composition.

EXAMPLE 2

A PEDOT:PSS ink composition was prepared in the same manner as in Example 1, with the exception that 2,4,6-trimethylpyridine was used as the amine compound, instead of triethylamine. The amount of the amine compound 2,4,6-trimethylpyridine contained in 4.2 g of the neutralized PEDOT:PSS aqueous dispersion thus obtained was measured to be 0.016 g.

COMPARATIVE EXAMPLE 1

4 g of PH-1000 (made by Heraeus) as a PEDOT:PSS aqueous dispersion was added with 0.2 g of ammonia water and then stirred for 2 hr. Thereafter, 0.2 g of DMSO, 4 g of DI water, 2.4 g of propylene glycol, 1.6 g of butyl carbitol, and 0.006 g of a surfactant F-555 (made by DIC) were added and then stirred, yielding a PEDOT:PSS ink composition.

COMPARATIVE EXAMPLE 2

4 g of PH-1000 (made by Heraeus) as a PEDOT:PSS aqueous dispersion was added with 0.2 g of DMSO, 4 g of DI water, 2.4 g of propylene glycol, 1.6 g of butyl carbitol, and 0.006 g of a surfactant F-555 (made by DIC) and then stirred, yielding a PEDOT:PSS ink composition.

COMPARATIVE EXAMPLE 3

4 g of PH-1000 (made by Heraeus) as a PEDOT:PSS aqueous dispersion was added with 0.2 g of DMSO, 4 g of DI water, 2.4 g of propylene glycol, 1.6 g of butyl carbitol, and 0.006 g of a surfactant F-555 (made by DIC) and then stirred for 2 hr. Thereafter, the resulting mixture was further added with 0.3 g of 3,5-diethylpyridine and then stirred, yielding a PEDOT:PSS ink composition.

Table 1 below shows the amount of the amine compound contained in the neutralized PEDOT:PSS aqueous dispersion of each of Examples 1 and 2 and Comparative Example 3. As is apparent from the following results, in the neutralized PEDOT:PSS aqueous dispersions of Examples 1 and 2 as prepared by the method according to the present invention, the amine compound is left behind in a small amount in the PEDOT:PSS aqueous dispersion after neutralization, thereby maintaining the dispersibility of PEDOT:PSS, compared to Comparative Example 3 where the amine compound was directly added to the ink composition. Furthermore, the pH of the resulting ink composition may be adjusted to a desired neutral pH value. Also, when forming the ink composition from the neutralized PEDOT:PSS aqueous dispersion according to the present invention, haze caused by scattering of light on a substrate may be lowered, and the resulting thin film may have low resistance and thus may manifest high conductivity.

TABLE 1

|  | Amine compound | Amine compound/Neutralized PEDOT:PSS aqueous dispersion (g) |
|---|---|---|
| Ex. 1 | Triethylamine | 0.017/4.2 |
| Ex. 2 | 2,4,6-trimethylpyridine | 0.016/4.2 |
| C. Ex. 3 | 3,5-diethylpyridine | 0.3/4.3 |

PREPARATION EXAMPLE

Each of the ink compositions of Examples 1 and 2 and Comparative Examples 1 to 3 was subjected to spin coating (500 rpm, 9 sec), and then dried on a hot plate at 120° C./30 min, thus forming individual PEDOT:PSS thin films.

<Evaluation of Properties of Ink Composition>
Measurement of pH

The ink compositions of Examples 1 and 2 and Comparative Examples 1 to 3 were measured for pH using a Jenway Model 430 portable pH/conductivity meter.

<Evaluation of Properties of Thin Film>

The PEDOT:PSS thin films formed in Preparation Example were measured for sheet resistance using a 4-point-probe. The results are shown in Table 2 below.

Also, transmittance and haze of the thin films were measured.

TABLE 2

|  | Amine compound | pH | Transmittance (%) | Haze | sheet resistance (Ω/) |
|---|---|---|---|---|---|
| Ex. 1 | Triethylamine | 7.5 | 89.16 | 0.35 | 804 |
| Ex. 2 | 2,4,6-trimethylpyridine | 5.7 | 88.45 | 0.55 | 335 |
| C. Ex. 1 | Ammonia water | — | — | — | — |
| C. Ex. 2 | X | 2.4 | 88.43 | 0.18 | 312 |
| C. Ex. 3 | 3,5-diethylpyridine | 6.1 | 89.85 | 4.43 | 4250 |

As is apparent from Table 2, the ink compositions of Examples 1 and 2 according to the present invention were formed into ink having neutral pH while maintaining dispersibility of PEDOT:PSS. The thin films formed therefrom had low sheet resistance and high transmittance, and could decrease haze caused by scattering of light on the substrate.

In contrast, the ink composition of Comparative Example 1 using ammonia water as the alkaline material caused the dispersibility of PEDOT:PSS to deteriorate, and thus a polymer lump was observed. The ink composition of Comparative Example 2 without the use of the amine compound had acidic pH.

Also, the ink composition of Comparative Example 3 including the amine compound directly added thereto was increased in pH, and no lump was observed, but the resulting thin film had high sheet resistance, undesirably considerably lowering the conductivity.

Based on the above evaluation results, the ink composition according to the present invention can possess pH adjusted to a desired level while maintaining dispersibility of PEDOT:PSS, thus exhibiting high processability in an inkjetting process. Moreover, a uniform transparent conductive polymer thin film having high transmittance and conductivity can be manufactured.

What is claimed is:

1. A method of preparing a neutralized PEDOT:PSS (Poly(3,4-ethylenedioxythiophene):poly(styrenesulfonate)) aqueous dispersion, comprising:
   a) mixing a PEDOT:PSS aqueous dispersion with an amine compound and an organic solvent that is separated from water, thus neutralizing the PEDOT:PSS aqueous dispersion;
   b) separating a mixture obtained in a) into a lower water layer including the neutralized PEDOT:PSS aqueous dispersion and an upper organic layer including the amine compound and the organic solvent;
   c) removing the upper organic layer; and
   d) washing the water layer separated from the organic layer with an organic solvent to remove the organic layer, yielding the neutralized PEDOT:PSS aqueous dispersion.

2. The method of claim 1, wherein the amine compound comprises at least one selected from the group consisting of a primary amine compound, a secondary amine compound, a tertiary amine compound, and a pyridine compound.

3. The method of claim 2, wherein the amine compound comprises at least one selected from the group consisting of triethylamine, 3,5-lutidine, and 2,4,6-trimethylpyridine.

4. The method of claim 1, wherein the organic solvent is diethyl ether.

5. The method of claim 1, wherein an amount of the organic solvent in a) is 50 - 500 parts by weight based on 100 parts by weight of the PEDOT:PSS aqueous dispersion.

6. The method of claim 1, wherein the amine compound in a) is present in an amount so that a concentration thereof in the organic solvent is 0.1 - 50 wt %.

* * * * *